United States Patent
Sakui

(10) Patent No.: US 6,618,292 B2
(45) Date of Patent: Sep. 9, 2003

(54) SEMICONDUCTOR MEMORY DEVICE AND METHOD OF OPERATING THE SAME

(75) Inventor: Koji Sakui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/986,895

(22) Filed: Nov. 13, 2001

(65) Prior Publication Data

US 2002/0057600 A1 May 16, 2002

(30) Foreign Application Priority Data

Nov. 13, 2000 (JP) ........................................ 2000-345586

(51) Int. Cl.$^7$ ................................................ G11C 16/04
(52) U.S. Cl. ............. 365/185.29; 365/218; 365/185.19; 365/185.27
(58) Field of Search ................... 365/185.29, 185.18, 365/218, 207, 185.19, 185.27

(56) References Cited

U.S. PATENT DOCUMENTS

| | | | | |
|---|---|---|---|---|
| 5,280,454 A | * | 1/1994 | Tanaka et al. | 365/185.17 |
| 5,473,563 A | | 12/1995 | Suh et al. | |
| 5,546,341 A | | 8/1996 | Suh et al. | |
| 5,657,271 A | * | 8/1997 | Mori | 365/185.27 |
| 6,009,017 A | * | 12/1999 | Guo et al. | 365/185.28 |
| 6,134,157 A | | 10/2000 | Takeuchi | |
| 6,240,022 B1 | * | 5/2001 | Sakui et al. | 365/185.29 |

OTHER PUBLICATIONS

Kang–Deog Suh, et al., "A 3.3 V 32 Mb Nand Flash Memory with Incremental Step Pulse Programming Scheme", IEEE Journal of Solid State Circuits, vol. 30, No. 11, Nov. 1995, pp. 1149–1156.

Ken Takeuchi, et al., "A Source–Line Programming Scheme for Low–Voltage Operation Nand Flash Memories", IEEE Journal of Solid–State Circuits, vol. 35, No. 5, May 2000, pp. 672–681.

Yoshihisa Iwata, et al., "A 35 ns Cycle Time 3.3 V Only 32 Mb Nand Flash EEPROM", IEE Journal of Solid–State Circuits, vol. 30, No. 11, Nov. 1995, pp. 1157–1164.

* cited by examiner

Primary Examiner—Vu A. Le
Assistant Examiner—Nam Nguyen
(74) Attorney, Agent, or Firm—Oblon, Spivak, McClelland, Maier & Neustadt, P.C.

(57) ABSTRACT

In a semiconductor memory device the potential of a semiconductor substrate and that of all of a plurality of word lines are increased to an erase voltage by means of a boosting circuit, and subsequently the potential of the word line selected by a word line selection circuit is decreased, when data of a memory cell is erased.

27 Claims, 10 Drawing Sheets

All word lines WL0~WL31 of unselected blocks selection gate lines SSL, GSL

All word lines WL0~WL31 of selected block

Bit lines BL0, BL1,···,BL4223 source line SL

P-type well region 12

Selection gate line SSL

Selected word line WL17 in selected block

Unselected word lines WL0~WL16, WL18~WL31 in selected block

Selection gate line GSL

Bit line BL0 for writing "0"

Bit line BL1 for writing "1"

Channel potential of NAND cell for writing "0"

Channel potential of NAND cell for writing "1"

Source line SL

P-type well region 12

Data reading

| | Potential |
|---|---|
| SSL | Vread1 |
| Selected word line WL17 in selected block | Vss |
| Unselected word lines WL0~WL16, WL18~WL31 in selected block | Vread1 |
| GSL | Vread1 |
| Bit line BL0 for reading "0" | Vbl→Vbl |
| Bit line BL1 for reading "1" | Vbl→Vss |
| SL | Vss |
| P-type well region | Vss |

FIG. 11

|  | Erase | Read | Write |
|---|---|---|---|
| Selected WLj | 0 | 0 | Vpgm |
| Unselected WLj | F | Vread | Vpass |
| SSL | F | Vread | Vcc |
| GSL | F | Vread | 0 |
| "0" BLi | F | 1.5 | 0 |
| "1" BLi | F | 0.7 | Vcc |
| P-type well region | Vera | 0 | 0 |

US 6,618,292 B2

1

SEMICONDUCTOR MEMORY DEVICE AND METHOD OF OPERATING THE SAME

CROSS REFERENCE TO RELATED APPLICATIONS

This application is based upon and claims the benefit of priority from the prior Japanese Patent Application No. 2000-345586, filed Nov. 13, 2000, the entire contents of which are incorporated herein by reference.

BACKGROUND OF THE INVENTION

1. Field of the Invention

This invention relates to a semiconductor memory device and a method of operating the same. More particularly, the present invention relates to a NAND type EEPROM (electrically erasable programmable read only memory) in which each memory cell unit (NAND cell) is formed by serially connecting a plurality of memory cells in the column direction.

2. Description of the Related Art

EEPROMs are known as a type of semiconductor memory devices where data can be electrically rewritten. Of EEPROMs, NAND type EEPROMs have been attracting attention because they can be adapted to a high degree of integration.

Each of the memory cells of a NAND type EEPROM comprises a MOS transistor having a stack gate structure. The memory cells of each column are connected in series and any two adjacent memory cells, or MOS transistors, share a common source/drain to produce NAND cells. Then, such NAND cells are arranged in rows to form a NAND cell block. A plurality of NAND cell blocks are arranged in the column direction to produce a memory cell array.

The drains of the NAND cells of each column of a memory cell array are commonly connected to a bit line by way of a first selection gate transistor. Similarly, the sources of the NAND cells of each column are connected to a common source line (grounded) by way of a second selection gate transistor. On the other hand, the control gates of each memory cell of a plurality of NAND cells are commonly connected in the row direction to form word lines (control gate lines). Similarly, the gate electrodes of the first and second selection gate transistors are commonly connected to form selection gate lines.

The papers (1) and (2) listed below describe NAND type EEPROMs having such a configuration.

(1) K. -D. Suh et al., "A 3.3 V 32 Mb NAND Flash Memory with Incremental Step Pulse Programming Scheme", IEEE J. Solid-State Circuits, Vol. 30, pp. 1149–1156, November 1995.

(2) Y. Iwata et al., "A 35 ns Cycle Time 3.3 V Only 32 Mb NAND Flash EEPROM", IEEE J. Solid-State Circuits, vol. 30, pp. 1157–1164, November 1995.

Now, the configuration of a known NAND type EEPROM will be described in greater detail by referring to the accompanying drawing.

FIG. 12 of the accompanying drawing is a schematic circuit diagram of memory cell array of a known NAND type EEPROM, showing only a NAND cell block NCB thereof.

Referring to FIG. 12, a NAND cell block NCB comprises a plurality of NAND cell units NCY arranged in rows. Each NAND cell unit NCY has NAND cells NC. Each NAND

2 cells NC is formed by a plurality of memory cells M. Each memory cell M comprises a MOS transistor having a stack gate structure. In other words, a number of MOS transistors are connected in series in such a way that any two adjacent MOS transistors share a common source/drain. NAND cells NC are formed in this way.

The drain of the MOS transistor located at an end of the NAND cells NC arranged in each row is connected to a selection gate transistor S1. Each of the selection gate transistors S1 is connected to a bit line BLi (i=0, 1, 2, ... ). The source of the MOS transistor located at the other end of the NAND cells NC arranged in each row is connected to another selection gate transistor S2. Each of the selection gate transistors S2 is connected to a common source line SL.

The control gates of memory cell M of the NAND cells NC arranged in each row are commonly connected to a word line WLj (j=0, 1, 2, ... ). The gate electrodes of the selection gate transistors S1 are commonly connected to a selection gate line SSL. The gate electrodes of the selection gate transistors S2 are commonly connected to another selection gate line GSL.

Normally, a plurality of NAND cell blocks NCB, each having a configuration as described above, are arranged in the column direction to produce a memory cell array. Note that each bit line BLi and each common source line SL are shared by a plurality of NAND cell block arranged in the column direction.

Each NAND cell block NCB operates as a smallest unit for erasing data. In other words, data are collectively erased on a NAND cell block by NAND cell block basis. The memory cells M connected to a selected word line WLj in a NAND cell block NCB are referred to as a page. In other words, a page provides a unit for reading and writing data.

If each memory cell M is an n-channel MOS transistor, an operation of erasing data, that of reading data and that of writing data proceed in a manner as described below.

The E type state and the D type state of an n-channel MOS transistor are made to correspond to respective binary numbers. The E state refers to a state where the threshold value of the transistor is positive when electrons are injected into the floating gate. The D type state refers to a state where the threshold value of the transistor is negative when electrons are ejected from the floating gate. For instance, the D type state may be defined as a "1" data holding state (erased state), whereas the E type state may be defined as a "0" data holding state (written state). Then, an operation of shifting the threshold value of the memory cell M holding a "1" data to the positive direction into a state where the memory cell M is holding a "0" data is defined as "a write operation". On the other hand, an operation of shifting the threshold value of the memory cell M holding a "0" data to the negative direction into a state where the memory cell M is holding a "1" data is defined as "an erase operation". The following description of the specification is based on the above definitions.

FIG. 13 of the accompanying drawing is a chart illustrating the bias voltage applied to a number of different parts of the selected NAND cell block (to be referred to simply as selected block hereinafter) NCB for an erase operation, a read operation and a write operation. Note that the memory cell M is an n-channel MOS transistor.

For a data erasing operation, 0V is applied to all the word lines WLj of the selected block NCB. The selection gate lines SSL, GSL and the bit lines BLi are held to a floating (F) state. A high positive erase voltage Vera (e.g., a 21 V pulse voltage with a cycle period of 3 ms) is applied to the P-type well region (substrate) of the cell region. As a result, the erase voltage Vera is applied between the P-type well region and the word lines WLj. Then, the electrons in the floating gate are ejected into the P-type well region by the FN tunnel current. Thus, each of the memory cells M in the selected block NCB is brought to the erased state of holding a "1" data.

On the other hand, the potential of the word lines WLj of each unselected NAND cell blocks (to be referred to as unselected block hereinafter) NCB is raised by way of capacitive coupling of the word lines WLj in the floating state and the P-type well region. The capacitive coupling ratio will be computed from the capacitance connected to the word lines WLj that are in the floating state. As a matter of fact, the capacitance of the word lines that are made of polysilicon and that of the P-type well region is high relative to the total capacitance. Therefore, the FN tunnel current will be prevented from flowing. Additionally, the threshold voltage of each and every memory cell M in the selected block NCB is checked to see if it has fallen below −1 V, for example for the purpose of verifying the erase operation.

For a data read operation, 0 V is applied to the selected word line WLj. A certain intermediary voltage Vread is applied to all the unselected word lines WLj and the selection gate lines SSL, GSL. The intermediary voltage Vread is a voltage necessary for making the channel region electrically conductive without relying on the threshold value. The data read operation is carried out by reading the change in the potential of the bit line BLi that takes place as a result of making the selected memory cell M electrically conductive or non-conductive.

Finally, for a data write operation, a high positive write voltage Vpgm is applied to the selected word line WLj. An intermediary voltage Vpass is applied to all the unselected word lines WLj. An operation voltage Vcc is applied to the selection gate line SSL located at the side of the bit lines BLi. The ground voltage Vss (=0 V) is applied to the selection gate line GSL located at the side of the common source lines SL. The ground voltage Vss is applied to the bit line BLi to be used for writing a "0" data and the operation voltage Vcc is applied to the bit lines BLi that need to be held to the erased state with a "1" data written thereto and where any write operation needs to be prohibited. At this time, the channel potential of the selected memory cell M connected to the bit line BLi to which the ground voltage Vss is applied is held to the ground potential Vss. As a result, a large electric field is applied between the control gate and the channel region. Then, electrons are injected from the channel region into the floating gate by the FN tunnel current. Note, however, that no sufficient electric field is applied to all the other unselected memory cells M that are connected to the same bit line BLi and to which the intermediary voltage Vpass is applied. Therefore, no electrons are injected into the floating gates of the unselected memory cells M by the FN tunnel current and hence no data is written to those memory cells M.

On the other hand, the memory cells M connected the bit line BLi to which the operation voltage Vcc is applied are cut off. In other words, the channel region of the NAND cell NC is preliminarily charged either to the operation voltage Vcc or to the voltage Vcc-Vth. As a result, the above memory cells M are cut off. Note that Vth is the threshold voltage of the selected memory cell M. Then, the write voltage Vpgm or the intermediary voltage Vpass is applied to the control gate of each and every cut off memory cell M. Thus, any injection of electrons is prevented from taking place. This is because the channel potential shows a rise due to the capacitive coupling of the channel region of the NAND cell NC that is in the floating state and the control gate to which the write voltage Vpgm or the intermediary voltage Vpass is applied.

In this way, electrons are injected only into the floating gate of the memory cell M located at the intersection of the bit line BLi to which the ground voltage Vss is applied and the selected word line WLj to which the write voltage Vpgm is applied. Thus, a "0" data is written to the memory cell M. On the other hand, the channel potential of each and every memory cell M in the selected block NCB to which any data is prohibited from being written is determined by the capacitive coupling of the word line WLj and the channel region of the NAND cell NC. Therefore, it is important to preliminarily charge the channel region with electricity to a satisfactory extent in order to sufficiently raise the write prohibition voltage.

Additionally, it is important to raise the capacitive coupling ratio between the word line WLj and the channel region.

The capacitive coupling ratio B between the word line WLj and the channel region is obtained by the formula shown below;

$$B=\text{Cox}/(\text{Cox}+Cj),$$

where Cox is the total sum of the gate capacitances between the word lines WLj and the channel regions and Cj is the total sum of the junction capacitances between the sources and the drains of the memory cells M. The sum of the total sum Cox of the gate capacitances and the total sum Cj of the junction capacitances is the channel capacitance of the NAND cell NC. All the other capacitances including the overlapping capacitances of the selection gate lines SSL, GSL and the capacitances between the bit lines BLi and the sources/drains are very small relative to the total channel capacitance and hence are disregarded here.

Now, some of the scaling problems of such known NAND type EEPROMs will be discussed below. The capacitance between the word lines that are made of polysilicon and the P-type well regions is relatively large in known NAND type EEPROMs. Therefore, the potential of the word lines of the unselected blocks where no data is erased is raised by the capacitive coupling of the word lines and the P-type well regions. With this arrangement, the erase prohibition voltage that is used when erasing a data is obtained for conventional NAND type EEPROMs.

However, the balance of capacitances changes as memory cells are dimensionally scaled up or down. In other words, the capacitance between the word lines made of polysilicon and the P-type well regions can become smaller than ever relative to the overall capacitance depending on the memory cell structure. Then, the potential of the word lines of the unselected blocks may not be raised sufficiently to give rise to a problem of erasing data by accident.

Additionally, since the capacitance of the P-type well region is very large in a cell region, it takes a long time to raise the potential of the word lines of the unselected blocks by means of a booster circuit. In other words, data may be erased during the transition time until the predetermined erase voltage is reached. Then, it is difficult to determine the actual erasure time.

Conventionally, the write prohibition voltage is produced by capacitive coupling of the word lines and the NAND cell channel regions in a data write operation. Then, again, it may be difficult to sufficiently raise the voltage of the channel regions depending on the scaling of the NAND type EEPROM. Write errors may occur when the voltage rise is not sufficient. Such write errors may be prevented from taking place by selectively supplying a write prohibition voltage by way of bit lines. Then, however, the column related transistors including sense amplifiers need to be so designed as to withstand high voltages to consequently increase the chip area and make the entire manufacturing process to be a complex one.

BRIEF SUMMARY OF THE INVENTION

According to a first aspect of the present invention, there is provided a semiconductor memory device comprising:

- a memory cell array arranged on a semiconductor substrate,
- the memory cell array being formed by arranging a plurality of memory cell units in array,
- each of the plurality of memory cell units being formed by connecting a plurality of rewritable memory cells to each of a plurality of word lines;
- a word line selection circuit which selects one of the plurality of word lines;
- a boosting circuit which boosts the potential of the semiconductor substrate and that of the plurality of word lines; and
- a control circuit which controls the boosting circuit,
- the control circuit being configured to increase the potential of the semiconductor substrate and that of all of the plurality of word lines to an erase voltage by means of the boosting circuit and to subsequently decrease the potential of the word line selected by the word line selection circuit, when data of a memory cell is erased.

According to a second aspect of the invention, there is provided a method of operating a semiconductor memory device comprising:

- a memory cell array arranged on a semiconductor substrate, the memory cell array being formed by arranging a plurality of memory cell units in array, each of the plurality of memory cell units being formed by connecting a plurality of rewritable memory cells to each of a plurality of word lines,
- a word line selection circuit which selects one of the plurality of word lines,
- a boosting circuit which boosts the potential of the semiconductor substrate and that of the plurality of word lines, and
- a control circuit which controls the boosting circuit;

the method comprising increasing the potential of the semiconductor substrate and that of all of the plurality of word lines to an erase voltage by means of the boosting circuit, and subsequently decreasing the potential of the word line selected by the word line selection circuit, when data of a memory cell is erased under the control of the control circuit.

BRIEF DESCRIPTION OF THE SEVERAL VIEWS OF THE DRAWING

FIG. 11 is a chart illustrating an ordinary data read operation of the NAND type flash memory of FIG. 1;

DETAILED DESCRIPTION FO THE INVENTION

Embodiments of the present invention will be described in greater detail with reference to the accompanying drawings.

Figure 1:
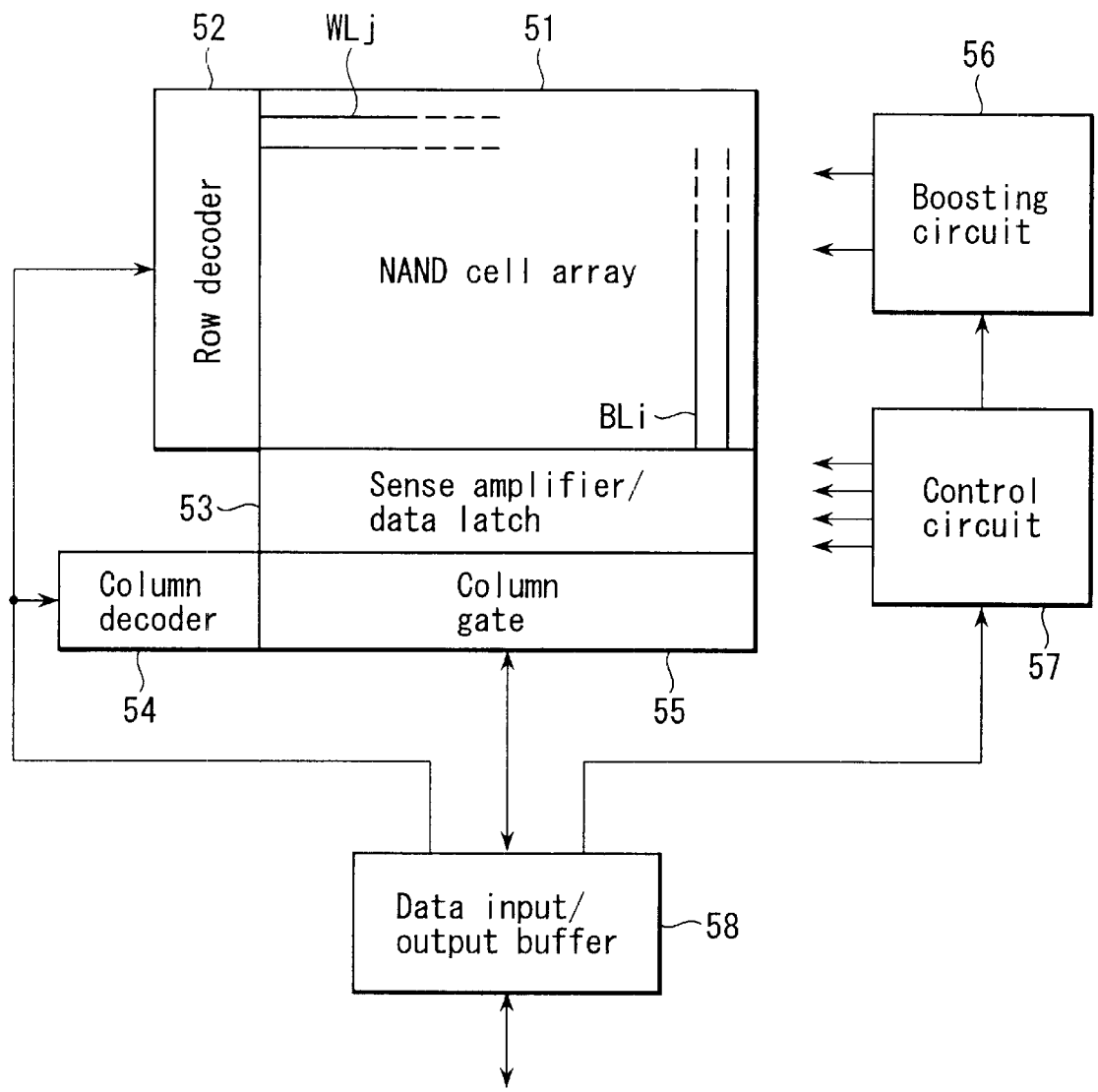
FIG. 1 is a schematic block diagram illustrating the chip configuration of NAND type flash memory according to an embodiment of the present invention.

FIG. 1 is a schematic block diagram of the chip configuration of NAND type flash memory (NAND type EEPROM) having a page writing/reading functional feature according to an embodiment of the present invention.

As shown in FIG. 1, the memory cell array (NAND cell array) 51 of NAND type flash memory is connected to a row decoder (word line selection circuit) 52. The row decoder 52 selects and drives one of the word lines WLj (j=0, 1, 2, . . . ) according to the externally input address. The bit lines BLi (i=0, 1, 2, . . . ) of the memory cell array 51 are connected to a sense amplifier circuit (sense amplifier/data latch) 53. The sense amplifier circuit 53 is provided with a latch feature for latching input/output data. The sense amplifier circuit 53 is connected to a column gate 55, which column gate 55 is connected to a column decoder (bit line selection circuit) 54. The column decoder 54 controls the column gate 55 according to the externally input address. Thus, one of the sense amplifiers of the sense amplifier circuit 53 that corresponds to the address is selected.

The row decoder 52, the column decoder 54 and the column gate 55 are connected to a data input/output (I/O) buffer 58, which data input/output buffer 58 is connected to a control circuit 57. The control circuit 57 is connected to a boosting circuit 56 that is adapted to generate a high voltage necessary for write and erase operations.

The control circuit 57 generates control signals for writing data to, erasing data from and reading data from the memory cell array 51 and controls the components of the chip by means of control signals. The control circuit 57 is also used as interface with the outside of the NAND type flash memory. The control circuit 57 includes a sequence control means (e.g., a programmable logic array). The sequence control means is used to control erase/erase verify, write/write verify and read operations for the NAND cells.

The row decoder 52 selects and drives one of a plurality of word lines WLj according to the address input to it for a data write operation, a data erase operation or a data read operation. The row decoder 52 supplies the word line driver (not shown) of the selected word line WLj with a required voltage.

The sense amplifier circuit 53 has the function of sensing a bit line data for a data read operation. It also has the data latch function of holding the externally loaded data for a data write operation. Additionally, it has the function of supplying the selected bit line BLi with a required voltage for a data write operation or a data erase operation.

Figure 2:
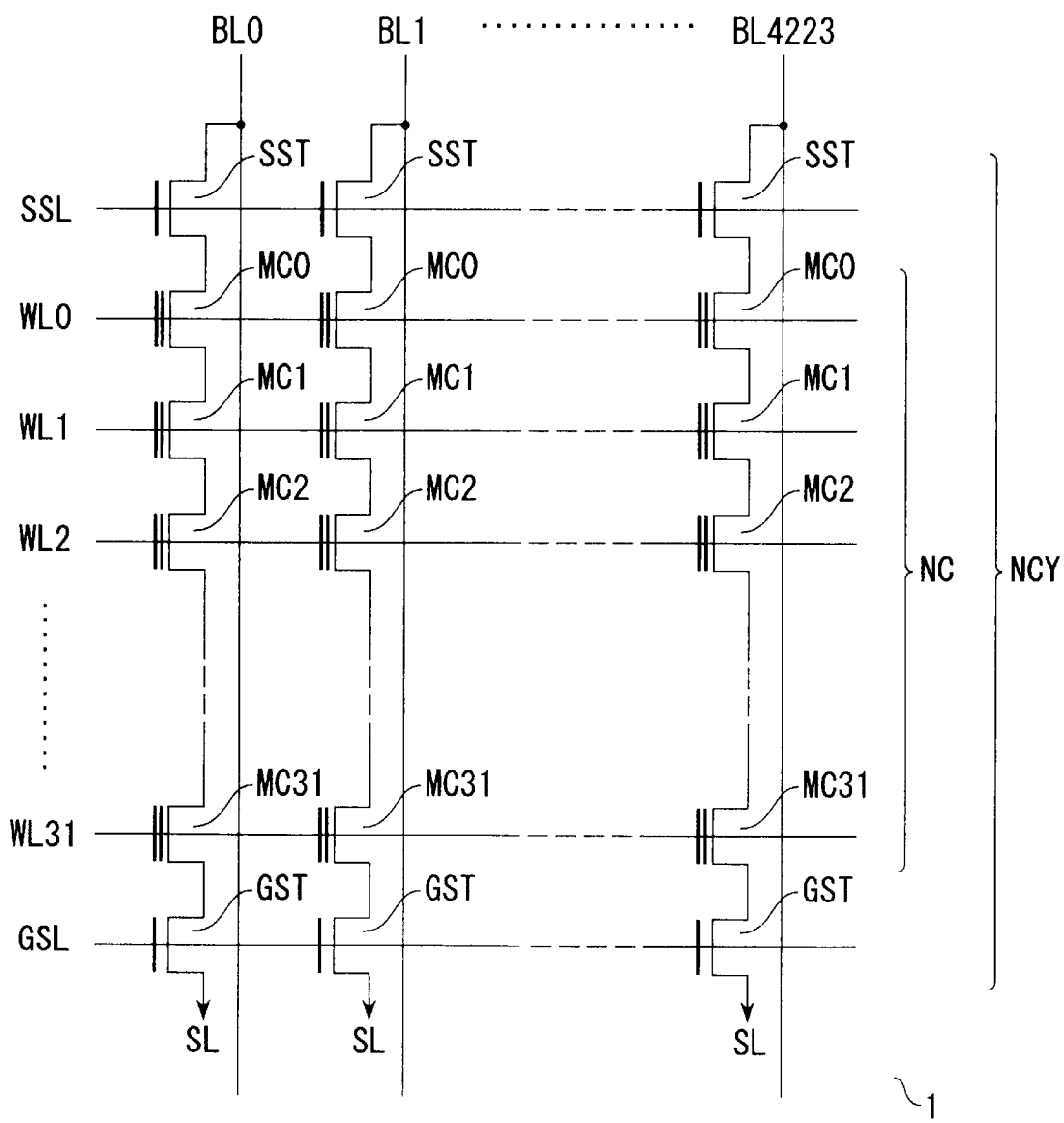
FIG. 2 is a schematic circuit diagram of part of the memory cell array of NAND type flash memory of FIG. 1.

FIG. 2 is a schematic circuit diagram of one of the NAND cell blocks 1 of the memory cell array 51 of NAND type flash memory of FIG. 1. Note that the illustrated NAND cell block 1 has a capacity of 528 bytes (the number of bit lines BLi is (512+16)×8=4224 (i=0 through 4223)).

In this embodiment, a total of 32 memory cell transistors MC0 through MC31 are connected in series between each bit line BLi and the corresponding source line SL to form a NAND cell (memory cell column) NC. A selection transistor (bit line side selection gate) SST is arranged between each bit line BLi and the corresponding memory cell transistor MC0. A selection transistor (source line side selection gate) GST is arranged between each source line SL and the corresponding memory cell transistor MC31. A NAND type memory cell unit (NAND type cell unit) NCY is formed to include the selection transistors SST, GST.

Figure 3:
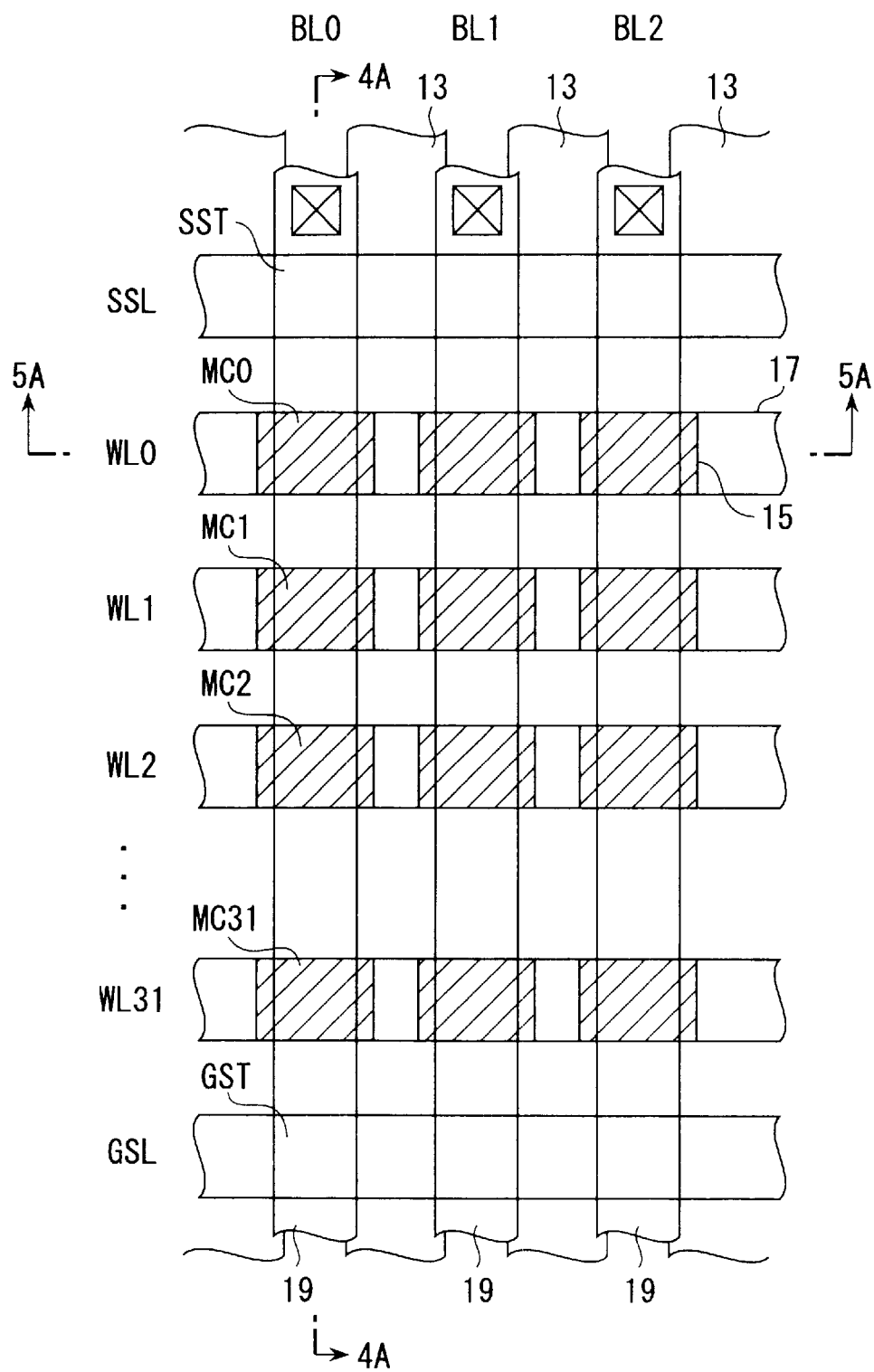
FIG. 3 is a schematic partial plan view of the layout of the memory cell array (NAND cell block) of FIG. 2.
Figure 4:
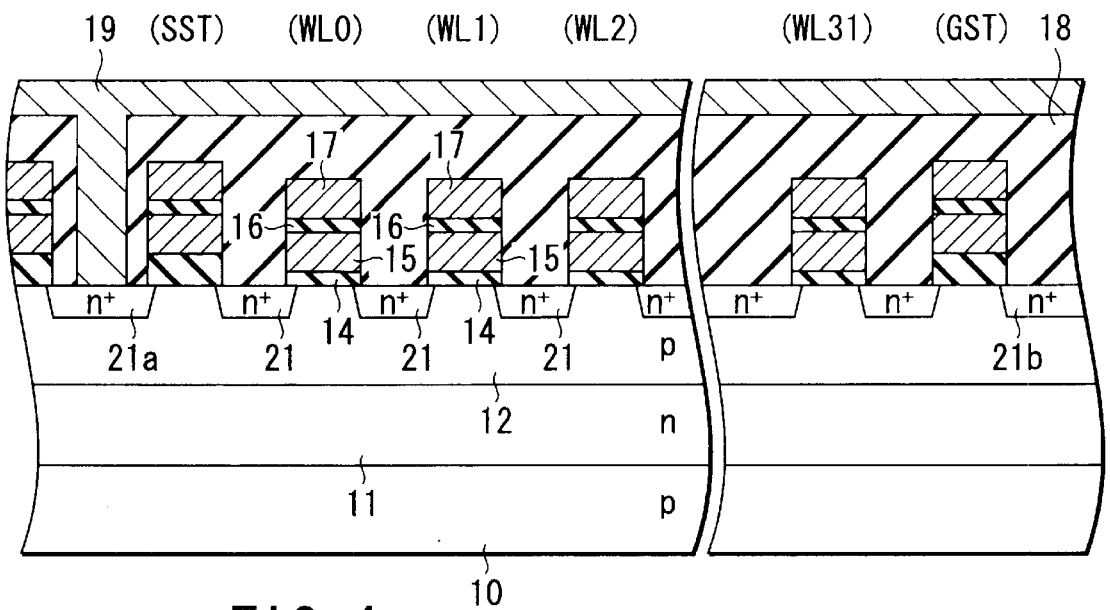
FIG. 4 is a schematic cross sectional view of the NAND cell block taken along line 4A—4A in FIG. 3.

FIG. 3 is a schematic partial plan view of the layout of the memory cell array (NAND cell block) of FIG. 2. FIG. 4 is a schematic cross sectional view of the NAND cell block taken along line 4A—4A in FIG. 3, and FIG. 5 is a schematic cross sectional view of the NAND cell block taken along line 5A—5A in FIG. 3.

Figure 5:
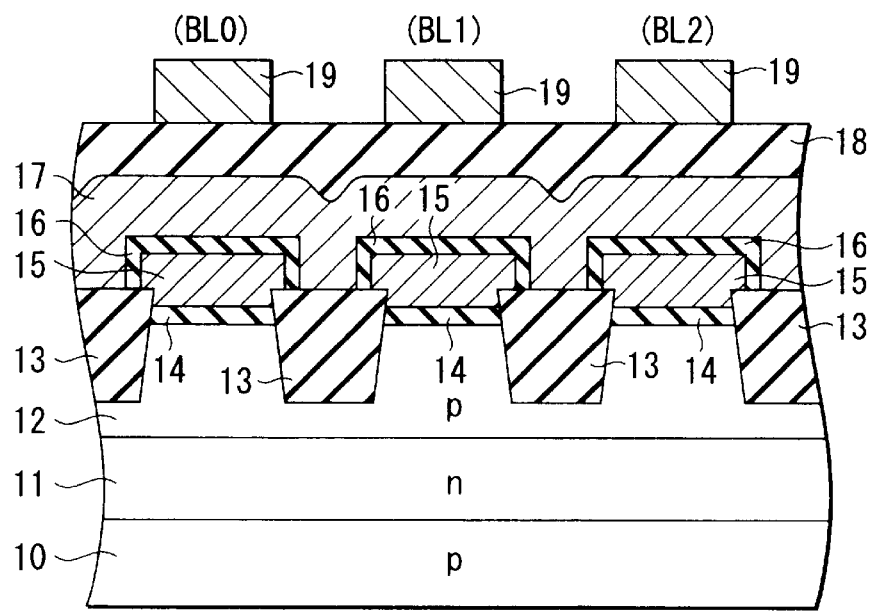
FIG. 5 is a schematic cross sectional view of the NAND cell block taken along line 5A—5A in FIG. 3.

Referring to FIGS. 3 through 5, an n-type well region (second conductivity type semiconductor impurity layer) 11 is formed on a p-type silicon substrate (first conductivity type semiconductor impurity layer) 10 in correspondence to a memory cell array region. A p-type well region (first conductivity type semiconductor impurity layer) 12 is formed on the n-type well region 11. A plurality of element separating regions are formed in the p-type well region 12 by means of element separating insulating film 13.

Tunnel oxide films (gate oxide films) 14 are formed on the surface of the p-type well region 12 in correspondence to element regions. Floating gate electrodes 15 are formed on the tunnel oxide films 14. To be more accurate, each of the memory cell transistors MC0 through MC31 is provided with a floating gate electrode 15. The surface of each floating gate electrode 15 is covered by an interlayer gate insulating film 16. A control gate 17 is formed on each row of interlayer gate insulating films 16.

As shown in FIGS. 3 and 5, control gates 17 are arranged continuously in the row direction to form so many word lines WLj (WL0, WL1, . . . , WL31).

As shown in FIG. 4, a source/drain diffusion layer 21 is formed on the surface area of the p-type well region 12 between any two adjacent control gates 17. The source/drain diffusion layers 21 are formed by injecting ions into the p-type well region 12, using the control gates 17 as masks.

A plurality of metal wiring layers 19 are arranged above the control gates 17 and the source/drain diffusion layers 21 with an interlayer insulating film 18 interposed between them. Each metal wiring layer 19 is extending in the column direction. As shown in FIG. 4, each metal wiring layer 19 is held in contact connection with the corresponding source/drain diffusion layer (n+-type diffusion layer) 21a of each selection transistor SST. As a result, the metal wiring layers 19 operates as bit lines BLi (BL0, BL1, . . . , BL4223). The source/drain diffusion layers 21b of the selection transistors GST are mutually connected. As a result, common source lines SL are formed.

As shown in FIG. 4, the selection transistors SST, GST have a structure which is substantially the same as that of the memory cell transistors MC0 through MC31. More specifically, a layer corresponding to a floating gate 15 and a layer corresponding to a control gate 17 are connected to each other as viewed in a cross section corresponding to that of FIG. 5. Additionally, a layer corresponding to a control gate 17 is laid continuously on the selection transistors SST and a similar layer is laid on the selection transistors GST to produce selection gate lines SSL and GSL respectively. The film thickness of tunnel oxide films of the selection transistors SST, GST and the memory cell transistors MC0 through MC31 may be differentiated.

Figure 6:
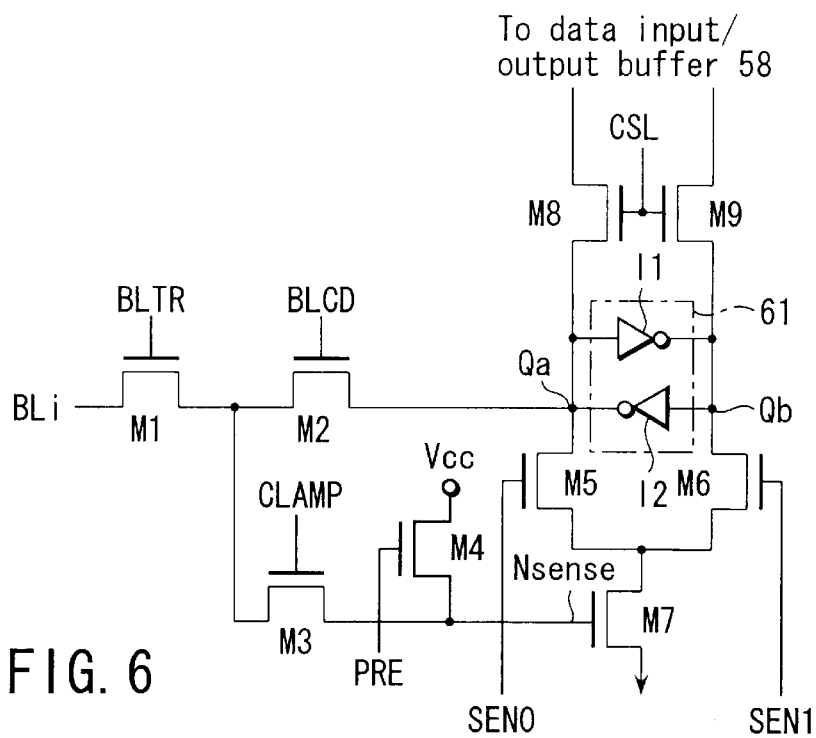
FIG. 6 is a schematic circuit diagram of the sense amplifier circuit of the NAND type flash memory of FIG. 1.
Figure 7A:
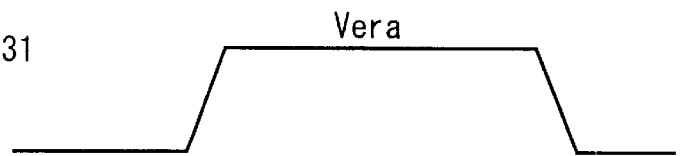
FIGS. 7A through 7D are timing charts for a data erasure operation of the NAND type flash memory of FIG. 1.
Figure 7B:
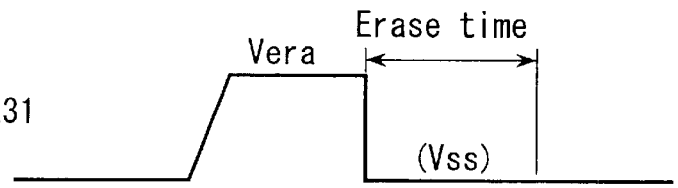
Figure 7C:
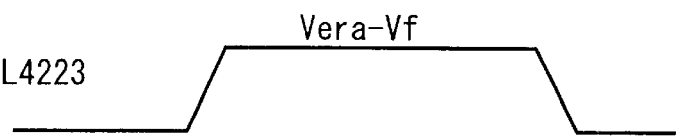
Figure 7D:
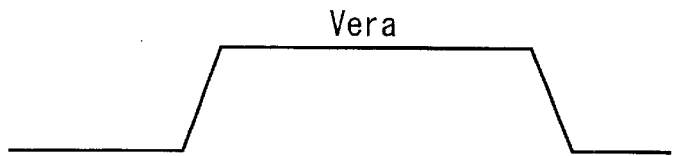
Figure 8A:
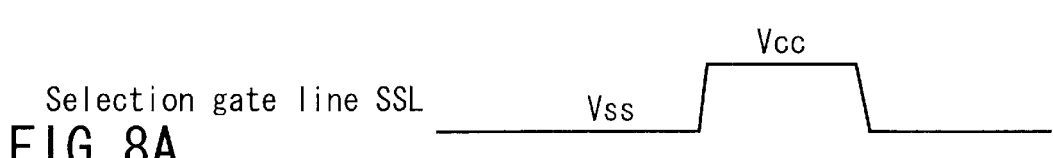
FIGS. 8A through 8J are timing charts for a data write operation of the NAND type flash memory of FIG. 1.
Figure 8B:
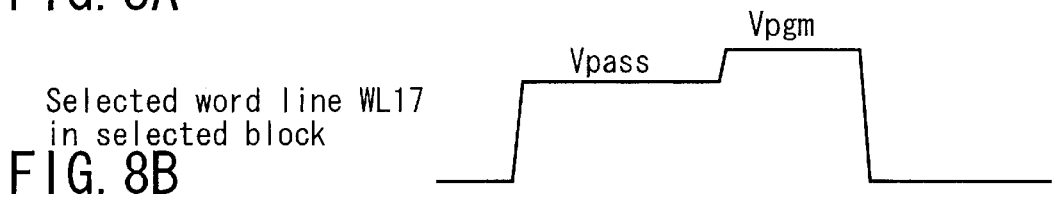
Figure 8C:
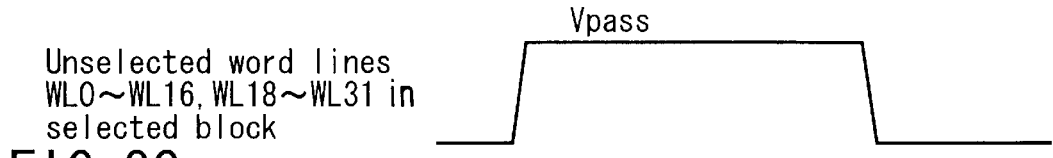
Figure 8D:
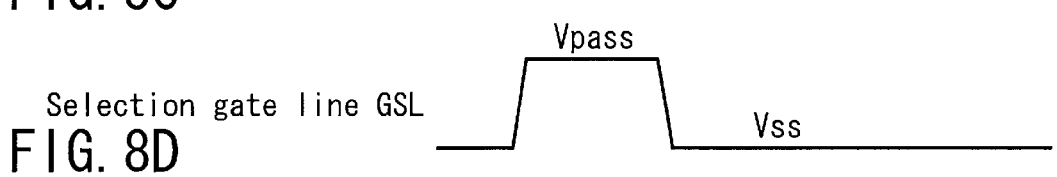
Figure 8E:
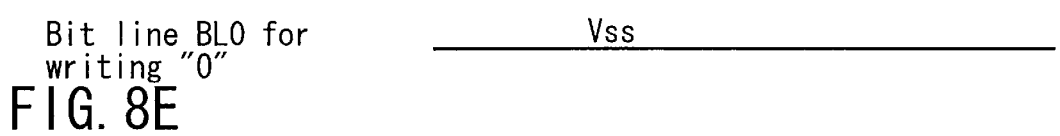
Figure 8F:
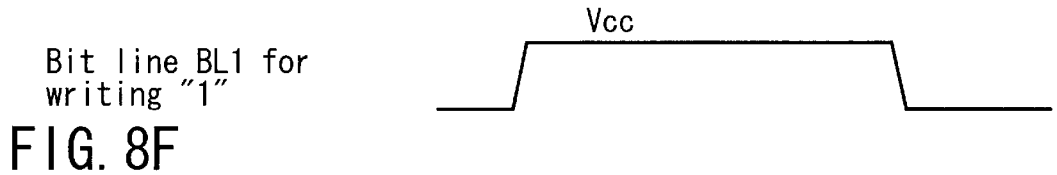
Figure 8G:
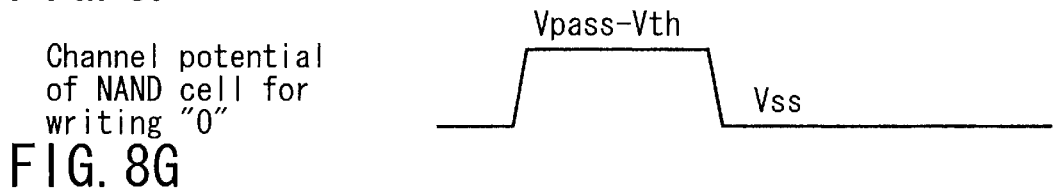
Figure 8H:
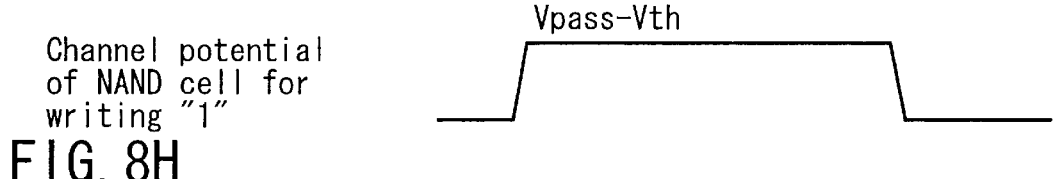
Figure 8I:
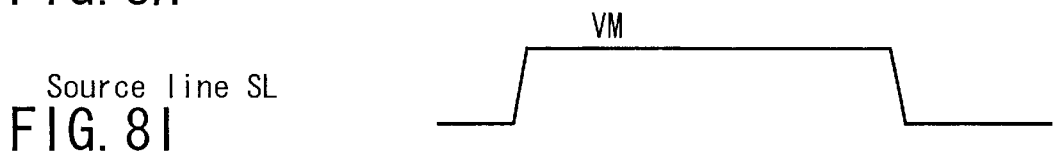
Figure 8J:

FIG. 6 is a schematic circuit diagram of one of the sense amplifier circuits 53 of the NAND type flash memory of FIG. 1. As shown, the sense amplifier is centered on a data latch circuit 61. The data latch circuit 61 is formed by connecting a pair of inverters I1, I2 that are arranged invertedly and connected in parallel relative to each other. The nodes Qa, Qb of the data latch circuit 61 are connected to the drain of a sense NMOS transistor M7 respectively by way of NMOS transistors M5, M6. The source of the sense NMOS transistor M7 is grounded. The gate of the sense NMOS transistor M7 operates as sense node Nsense.

The sense node Nsense is provided with an NMOS transistor M4 for precharging it. Additionally, the sense node Nsense is connected to a corresponding bit line BLi by way of the transfer gate NMOS transistors (bit line transfer gates) M3, M1. The NMOS transistor M1 is a buffer transistor adapted to withstand a high voltage in a data erase operation.

The node Qa of the data latch circuit 61 is connected to an NMOS transistor M2, which is used to transfer write data to the corresponding bit line BLi. The NMOS transistor M2 is connected to the NMOS transistors M1, M3.

The nodes Qa, Qb of the data latch circuit 61 are also connected to the data input/output buffer 58 respectively by way of column selection NMOS transistors M8, M9.

The gate of the transistor M1 is controlled by signal BLTR. The gate of the transistor M2 is controlled by signal BLCD. The gate of the transistor M3 is controlled by signal CLAMP. The gate of the transistor M4 is controlled by signal PRE. The gate of the transistor M5 is controlled by signal SEN0. The gate of the transistor M6 is controlled by signal SEN1. The gates of the transistors M8, M9 are controlled by signal CSL.

Now, the operation of erasing data, that of writing data and that of reading data of the NAND type flash memory will be described below.

FIGS. 7A through 7D illustrate the bias voltages of a number of different parts of the NAND type flash memory in a data erase operation. In this embodiment, each NAND cell block provides the smallest unit in the operation of erasing data.

As an erase operation start, an address is externally input by way of the data input/output buffer 58. Then, the control circuit 57 controls the row decoder 52 according to the input address. Thus, all the word lines WL0 through WL31 of the memory cell array 51 corresponding to all the blocks including the block selected for the data erasing operation are brought into a selected state.

Subsequently, the boosting circuit 56 is controlled by the control circuit 57. As a result, erase voltage Vera (=20 V) is applied to all the word lines WL0 through WL31, the selection gate lines SSL, GSL and the p-type well region 12 of the memory cell arrays 51 by the boosting circuit 56. At this time, the PN junctions of the p-type well region 12 and the source/drain diffusion layers 21a that are contact sections of the bit lines BL0, BL1, . . . , BL4223 are brought into a forwardly biased state. Also, the PN junctions of the p-type well region 12 and the source/drain diffusion layers 21b operating as source lines SL are brought into a forwardly biased state. As a result, the potentials of the bit lines BL0, BL1, . . . , BL4223 and those of the source lines SL are raised to the voltage Vera-Vf for prohibiting data erasure. Vf represents the built-in potential (e.g., about 0.7 V) of the PN junctions. Thus, the potentials of the bit lines BL0, BL1, . . . , BL4223 and those of the source lines SL come to be equal to about 19.3 V. Therefore, no data erase operation takes place in the memory cell transistors MC0 through MC31 connected to the respective word lines WL0 through WL31 of the unselected blocks.

Thereafter, each of the word lines WL0 through WL31 of the selected bock is grounded (Vss) by way of the row decoder 52 under the control of the control circuit 57.

In the selected block, on the other hand, the erase voltage Vera is applied to the substrate region (p-type well region 12). Additionally, the ground potential Vss is applied to the control gates 17 of the memory cell transistors MC0 through MC31 connected to the respective word lines WL0 through WL31. Thus, electrons are ejected from the floating gate 15 into the substrate region to produce a FN tunnel current. As a result, all the data stored in the memory cell transistors MC0 through MC31 are collectively erased.

As described above, the potentials of the word lines WL0 through WL31 of all the unselected blocks are raised directly by means of the boosting circuit 56 in a data erase operation. In other words, the erase voltage Vera is applied simultaneously to all the word lines WL0 through WL31 of the memory cell array 51 and to the p-type well region 12 from the boosting circuit 56. Then, the potentials of the word lines WL0 through WL31 of the block selected for the data erase operation are grounded after the potential rise. Thus, the potentials of the word lines WL0 through WL31 of all the unselected blocks are brought to the potential level of the p-type well region 12. With this arrangement, the problem of erroneously erasing data from the unselected block is dissolved.

Additionally, after raising the potentials of all the word lines WL0 through WL31 and that of the p-type well region 12, only the potentials of the word lines WL0 through WL31 of the selected block are brought to the ground level (by an electric discharge). Normally, the time required for an electric discharge is much shorter than the time required for raising the potential. Therefore, the effective erase time can be determined with ease.

Figure 9:
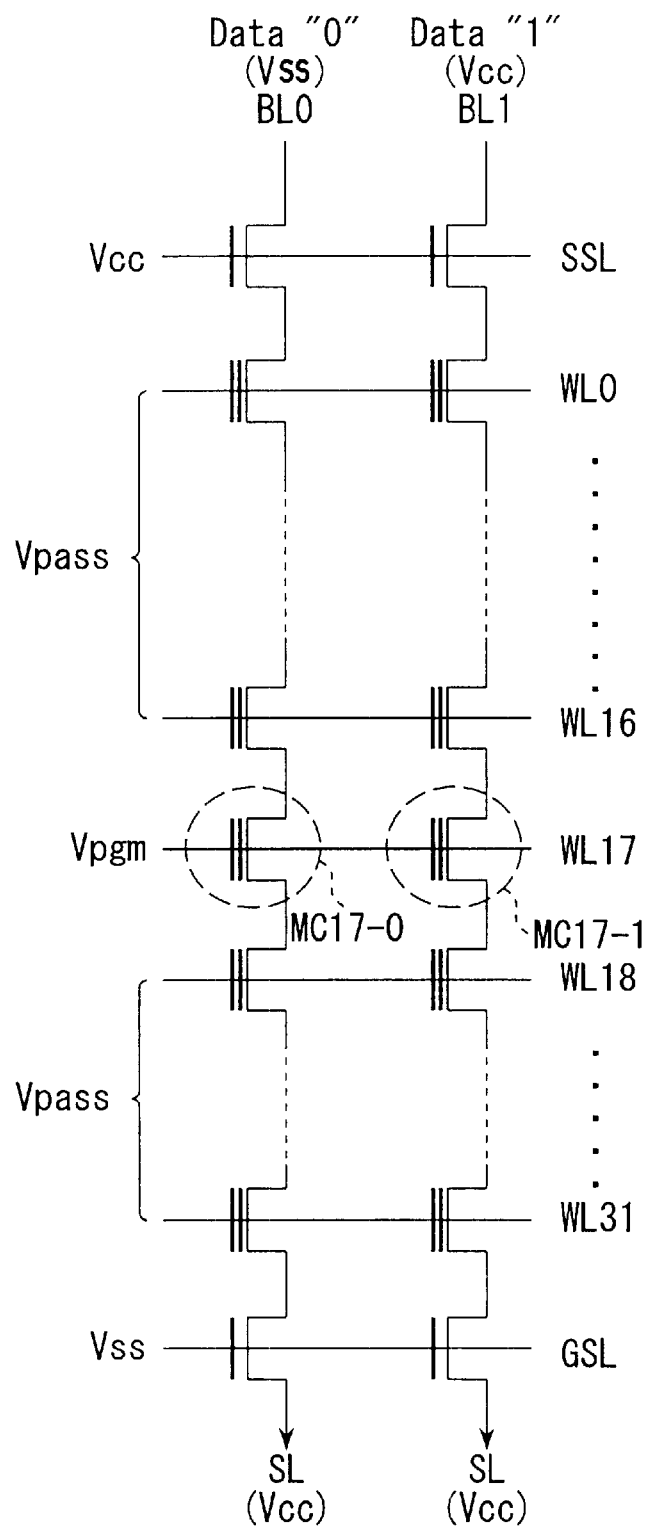
FIG. 9 is a schematic circuit diagram of two bits lines of the NAND type flash memory of FIG. 1 for supplementary illustration of the data write operation of FIGS. 8A through 8J.

FIGS. 8A through 8J illustrate the bias voltages of a number of different parts of the NAND type flash memory in a data write operation. Here, assume that the word line WL17 of the selected block from which all the data have been collectively erased in a manner as described above is used for the data erase operation. Also assume that the bit line BL0 is used to write data "0", whereas the bit line BLI is used to write data "1" (and hence it is held to the data erase state and prohibited against writing data there). FIG. 9 is a schematic circuit diagram of two bits lines BL0, BL1 of the NAND type flash memory of FIG. 1 for supplementary illustration of the data write operation of FIGS. 8A through 8J.

Referring to FIGS. 8A through 8J, firstly an address is externally input by way of the data input/output buffer 58. Then, the row decoder 52 is controlled by the control circuit 57 according to the input address. In this case, the word lines WL0 through WL31 of the selected block into which data are to be written are brought into the selected state.

Subsequently, the boosting circuit 56 is controlled by the control circuit 57. Then, the source lines SL are electrically charged to potential VM (about 8 to 10 V).

Thereafter, the boosting circuit 56 is controlled by the control circuit 57 in such a way that voltage Vpass (about 8 to 10 V) is applied to the selection gate lines GSL at the source side and the word lines WL0 through WL31 of the selected block into which data are to be written from the boosting circuit 56. At this time, the channel potential of the selected block is raised by the source lines SL. More specifically, the channel potential is raised to the level of the voltage Vpass-Vth (or the voltage Vpass less the threshold voltage of the selection transistors or that of the memory cell transistors, whichever higher).

At the same time (or before or after the potential rise), the sense amplifier circuit 53 is controlled by the control circuit 57 so that the sense amplifier circuit 53 applies the ground potential Vss to the bit line BL0 for the write operation and the supply voltage Vcc (=3.3 V) to the bit line BL1 for prohibiting any write operation. At this time, the selection gate line SSL at the bit line side is held to the ground potential Vss.

Thereafter, the potential of the selection gate line GSL at the source line side is lowered to the ground potential Vss under the control of the control circuit 57. At the same time, the potential of the selection gate line SSL at the bit line side is raised to a level above the threshold voltage Vth of the selection transistors GST (but lower than the supply voltage Vcc). As a result, the channel potential of the NAND cells connected to the bit line BL0 is controlled and held to the ground potential Vss for the write operation. The channel potential of the NAND cells connected to the bit line BL1 is held to the voltage Vpass-Vth for prohibiting any write operation.

Under this condition, the potentials of the unselected word lines WL0 through WL16 and WL18 through WL31 of the selected block that are not used for the write operation are held to the voltage level of Vpass. On the other hand, the higher write voltage Vpgm (about 16 V) is applied to the word line WL17 selected for the write operation from the boosting circuit 56 under the control of the control circuit 57.

At this time, the channel regions at the side of the bit line BL1 in the selected block are substantially held to the voltage level of Vpass-Vth. The voltage applied to the single word line WL17 selected for the write operation is raised from Vpass to Vpgm. However, the potentials of all the remaining thirty one word lines WL0 through WL16 and WL18 through WL31 to which the voltage Vpass is applied are held to the voltage level of Vpass. As a result, the channel regions of the NAND cells at the side of the bit line BL1 are held to the voltage level of Vpass-Vth for prohibiting any write operation. Therefore, no write operation of writing data "1" takes place even for the memory cell transistor MC17-1 that is driven by the selected word line WL17 to which the write voltage Vpgm is applied.

On the other hand, at the side of the bit line BL0, the ground voltage Vss fed from the bit line BL0 is made to get to the channel region of the selected memory cell transistor MC17-0 (see FIG. 9). Thus, a write operation of writing data "0" is carried out in the memory cell transistor MC17-0 that is driven by the selected word line WL17 to which the write voltage Vpgm is applied as a result of an injection of a FN tunnel current.

Note, however, that no large electric field is applied between the channel regions of all the other memory cell transistors connected to the same bit line BL0 and the control gate 17. In other words, no FN tunnel current is injected for writing data into any other memory cell transistors and therefore no write operation of writing data "0" takes place there.

In this way, in a data write operation, the write prohibition voltage Vpass-Vth is supplied to the channel regions from the source lines SL without relying on conventional capacitive coupling. As a result, the problem of errors in write operations can be minimized. The technique of preventing the operation of writing data "1" by supplying a voltage from the source lines to electrically charging the channel regions of NAND cells is disclosed, for instance, in Jpn. Pat. Appln. KOKAI Publication No. 10-275481 ((3) K. Takeuchi et al., "A Source-Line Programming Scheme for Low-Voltage Operation NAND Flash Memories," IEEE J. Solid-State Circuits, vol. 35, pp. 672–681, May. 2000).

In the above embodiment of the present invention, it is no longer necessary to design a column related transistors that can withstand high voltages because the voltage applied to it is reduced if compared with the conventional method of selectively supplying a write prohibition voltage from a bit line. Therefore, the increase, if any, in the chip area can be disregarded and the overall manufacturing process can be remarkably simplified.

In an actual data write operation, a cycle of applying a write voltage pulse and verifying related threshold values after the application of the write voltage pulse is repeated under the sequence control of the control circuit 57 shown in FIG. 1 to put the data of a page within a predetermined range defined by the threshold values. A page of data may correspond to the total number of bit lines connected to a word line. The total number of bit lines per word line may be made to correspond to two pages depending on the relationship with the page input/output buffer (not shown).

Now, the data write cycle on a page by pages will be discussed further below.

The data to be written are consecutively loaded in the data latching in the sense amplifier circuit 53 shown in FIG. 1. Note that "0" is a cell data to be used for a write operation and "1" is a cell data to be used for a write prohibiting operation. A data write cycle typically includes steps (1) through (9) listed below.

Step (1): The source lines SL are charged to VM (about 8 to 10 V).

Step (2): Voltage Vpass (about 8 to 10 V) is applied to the selection gate line GSL and the word lines WL0 through WL31 of the block selected for the data write operation.

Step (3): The channel potentials of the NAND cells of the selected block are raised by means of the source lines SL and raised to the write prohibition voltage Vpass-Vth.

Step (4): The potentials of the bit lines BL0, BL1 are selected simultaneously with (or before or after) the above Step (3) so as to be equal to the ground potential Vss and the supply voltage Vcc respectively according to the data to be written. At the same time, the potential of the bit line side selection gate line SSL is held to the ground potential Vss.

Step (5): The potential of the source line side selection gate line GSL is lowered to the ground potential Vss. At the same time, the potential of the bit line side selection gate line SSL is raised to above the threshold voltage Vth of the selected transistor SST (but not higher than the supply voltage Vcc).

Step (6): The ground potential Vss is supplied to the channel regions of the NAND cells connected to the bit line BL0 for the data write operation. However, the potentials of the channel regions of the NAND cells connected to the bit line BL1 are held to the voltage Vpass-Vth for write prohibition.

Step (7): The write voltage Vpgm is applied to the selected word line (word line WL17 in this instance) of the selected block. At this time, the potentials of the unselected word lines (word lines WL0 through WL16, WL18 through WL31 in this instance) of the selected block are held to the level of the voltage Vpass.

Step (8): The potentials of the word lines WL0 through WL31 of the selected block are lowered by means of electric discharge. Subsequently, the potentials of the channel regions of the NAND cells connected to the bit line BL0 and those of the NAND cells connected to the bit line BL1 are also lowered by means of electric discharge.

Step (9): The written data is read out for a write verify operation.

Figure 10:
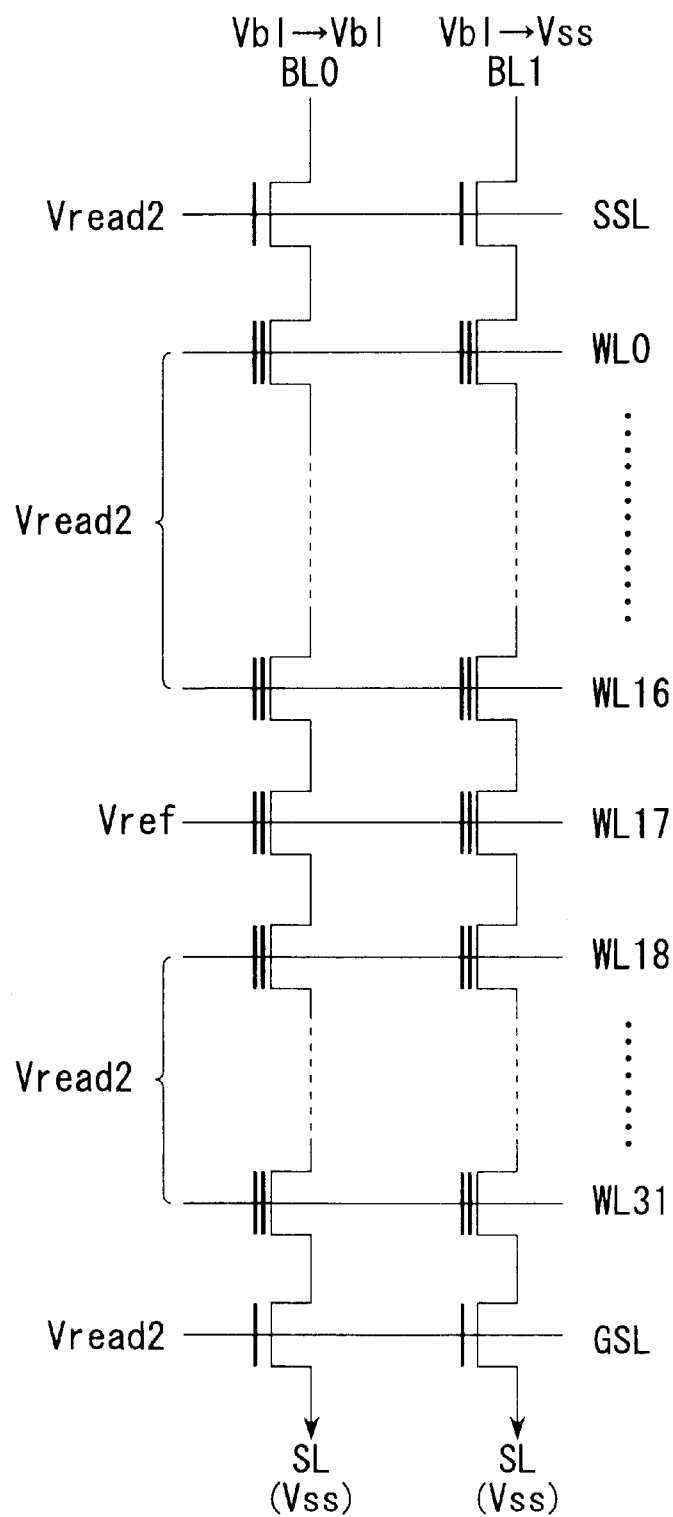
FIG. 10 is a schematic circuit diagram of two bit lines of the NAND type flash memory of FIG. 1 for illustrating a data write verify operation.
Figures 12, 13:
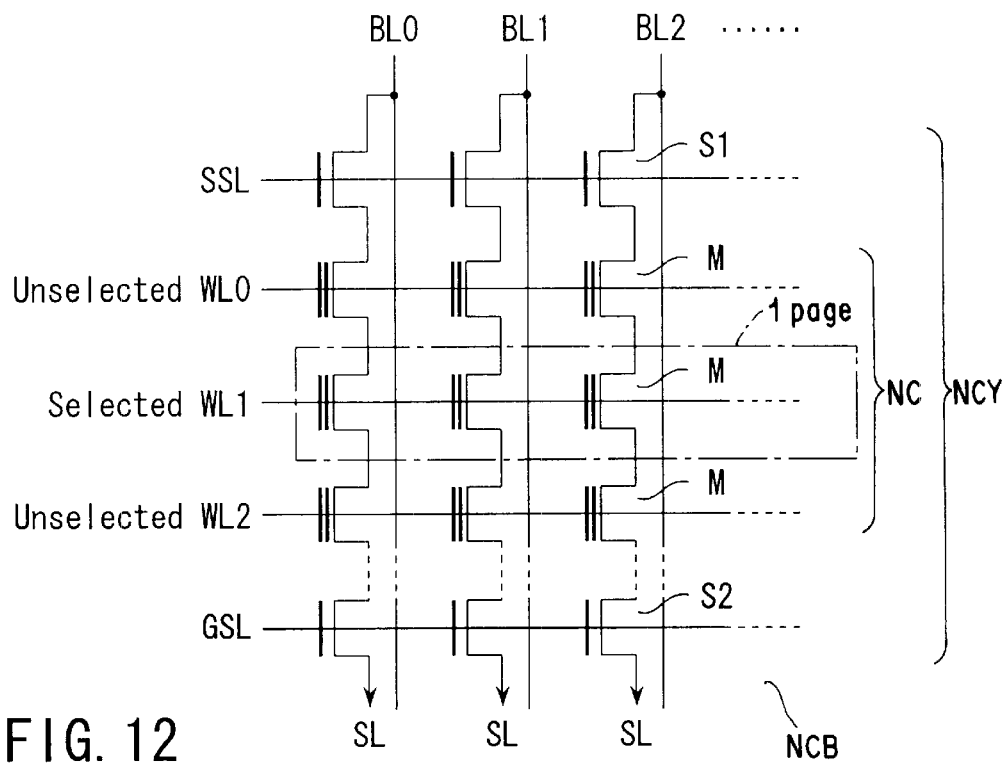
FIG. 12 is a schematic partial circuit diagram of a known NAND cell block for explaining a prior art and problems thereof.
FIG. 13 is a chart illustrating operations of a conventional NAND type EEPROM.

FIG. 10 is a schematic circuit diagram of two bit lines of the NAND type flash memory of FIG. 1 for illustrating a data write verify operation.

In a data write verify operation, the data written in the data latch corresponding to a cell where a data is written satisfactorily is changed from "0" to "1" so that no further data write operation may be conducted there. Additionally, as soon as a data read operation is started, the bit lines BL0, BL1 are preliminarily charged to the level of the initial voltage Vb1 (about 1.5 V). A verify read voltage Vref (about 0.7 V) is applied to the selected word line WL17 of the selected block into which a data is written.

Then, a voltage Vread2 is applied to all the unselected word lines WL0 through WL16 and WL18 through WL31 and the selection gate lines SSL, GSL in the selected block. The voltage Vread2 is used to make the memory cell transistors and the selection transistors SST, GST electrically conductive. The voltage Vread2 is made equal to voltage Vread1 (about 3.5 V) to be applied to the unselected word lines WL0 through WL16 and WL18 through WL31 of the selected block for an ordinary data read operation, which will be described hereinafter. The voltage Vread2 will typically be equal to about 8 V if it is made higher than the voltage Vread1.

As a result, the bit line BL0 to be used for reading data "0" (the data of the memory cell transistor whose threshold value exceeds Vref and hence that is brought into a write state) is held to voltage Vb1. On the other hand, the bit line BL1 to be used for reading data "1" (the data of the memory cell transistor that is brought into a erase state) is brought from the voltage Vb1 to the ground voltage Vss. The change in the potential of the bit line BL1 is detected by the sense amplifier. Then, the data "0" and the data "1" are determined as in the case of an ordinary data read operation.

The data write operation is repeated in the next cycle only for each memory cell transistor where the data is written unsatisfactorily as determined by the data read operation for the above write verify operation.

FIG. 11 is a chart illustrating the bias voltages of a number of different parts of the NAND type flash memory in an ordinary data read operation.

Referring to FIG. 11, as the read operation starts, the bit lines BL0, BL1 are preliminarily charged to the voltage Vb1 (about 1.5 V) of the initial state. Then, the ground voltage Vss is applied to the selected word line (word line WL17 in the instances of FIGS. 9 and 10) of the selected block as read voltage.

Voltage Vread1 is applied to the selection gate lines SSL, GSL and all the unselected word lines WL0 through WL16 and WL18 through WL31 of the selected block.

As a result, the bit line BL0 to be used for reading the data "0" (of the memory cell transistor in the write state) is held to the voltage Vb1, whereas the bit line BL1 to be used for reading the data "1" (of the memory cell transistor in the erase state) is brought from the voltage Vb1 to the ground voltage Vss. The change in the potential of the bit line BL1 is detected by the sense amplifier as in a conventional device and then the data "0" and the data "1" are determined.

With the above described arrangement, it is now possible to selectively reduce the potential of the word line connected to the memory cell transistor from which a data is to be erased. In other words, for a data erase operation, the potentials of all the word lines of the memory cell array are raised to the erase prohibition voltage level. Subsequently, only the potentials of the word lines of the selected block including the memory cell transistor from which a data is to be erased is brought to the ground potential level. As a result, the potentials of the word lines of the unselected blocks from which no data will be erased can easily be brought to the level of the p-type well region without raising them by capacitive coupling of the word lines and the p-type well region. Therefore, any erroneous erasure of data of the memory cell transistors connected to the word lines of the unselected block can be reliably prevented.

Additionally, the process of electric discharge for bringing down the potentials of the word lines that have been raised can be carried out in a short period of time if compared with the time required for raising the potentials of the word lines. As a result, the effective erase time can be determined with ease.

The above embodiment is directed to the NAND type flash memory. However, the present invention is not limited to this but can equally be applied to an AND type or DINOR type flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array arranged on a semiconductor substrate,
   said memory cell array being formed by arranging a plurality of memory cell units in array,
   each of said plurality of memory cell units being formed by connecting a plurality of rewritable memory cells to each of a plurality of word lines;
   a word line selection circuit which selects one of said plurality of word lines;
   a boosting circuit which boosts the potential of said semiconductor substrate and that of said plurality of word lines; and
   a control circuit which controls said boosting circuit, said control circuit increasing the potential of said semiconductor substrate and that of all of said plurality of word lines to an erase voltage by said boosting circuit and subsequently decreasing the potential of the word line selected by said word line selection circuit.

2. The device according to claim 1, wherein each of said plurality of memory cell units comprises columns of memory cells formed by connecting memory cells in series, bit line side selection gates connected in series respectively between said columns of memory cells and the bit lines and source line side selection gates connected in series respectively between said columns of memory cells and the source lines.

3. The device according to claim 1, wherein said memory cell array comprises a plurality of cell blocks, each of said plurality of cell brocks having a predetermined number of memory cell units of said plurality of memory cell units.

4. The device according to claim 1, wherein said memory cell array comprises a plurality of cell blocks, said word line selection circuit being selected of said plurality of word lines on the basis of a unit of cell block when data of a memory cell is erased.

5. The device according to claim 1, wherein said semiconductor substrate comprises a semiconductor impurity layer of the first conductivity type, a first well region of a semiconductor impurity layer of the second conductivity type being formed on the surface of said semiconductor substrate, and a second well region of semiconductor impurity layer of the first conductivity type being formed on the surface of said first well region, said memory cell array being formed on the surface of said second well region.

6. A semiconductor memory device comprising:
   a memory cell array arranged on a semiconductor substrate,
   said memory cell array being formed by arranging a plurality of NAND type memory cell units in array,
   each of said plurality of NAND type memory cell units being formed by connecting a plurality of rewritable nonvolatile memory cells in series, said plurality of rewritable nonvolatile memory cells being connected respectively to a plurality of word lines,
   each of said plurality of NAND type memory cell units being connected at an end thereof to a plurality of bit lines and at the other end thereof to a common source line;
   a word line selection circuit which selects one of said plurality of word lines;
   a bit line selection circuit which selects one of said plurality of bit lines;
   a sense amplifier circuit connected to said plurality of bit lines;
   said sense amplifier circuit having a latch function;
   a transfer gate being arranged between said sense amplifier circuit and said plurality of bit lines; a boosting circuit which boosts the potentials of said semiconductor substrate and said plurality of word lines; and
   a control circuit which controls said boosting circuit, said control circuit increasing the potentials of said semiconductor substrate and that of all of said plurality of word lines to an erase voltage by said boosting circuit and subsequently decreasing the potential of the word line selected by said word line selection circuit.

7. The device according to claim 6, wherein each of said plurality of NAND type memory cell units comprises columns of nonvolatile memory cells formed by connecting nonvolatile memory cells in series, bit line side selection gates connected respectively in series between said columns of nonvolatile memory cells and said plurality of bit lines and source line side selection gates connected respectively in series between said columns of nonvolatile memory cells and said common source lines.

8. The device according to claim 6, wherein said memory cell array comprises a plurality of cell blocks, each of said plurality of cell blocks having a predetermined number of NAND type memory cell units of said plurality of NAND type memory cell units.

9. The device according to claim 6, wherein said memory cell array comprises a plurality of cell blocks, said word line selection circuit being selected of said plurality of word lines on the basis of a unit of cell block when data of a nonvolatile memory cell is erased.

10. The device according to claim 6, wherein said semiconductor substrate comprises a semiconductor impurity layer of the first conductivity type, a first well region of a semiconductor impurity layer of the second conductivity type being formed on the surface of said semiconductor substrate, and a second well region of semiconductor impurity layer of the first conductivity type being formed on the surface of said first well region, said memory cell array being formed on the surface of said second well region.

11. A method of operating a semiconductor memory device, said semiconductor memory device including
a memory cell array arranged on a semiconductor substrate, said memory cell array being formed by arranging a plurality of memory cell units in array, each of said plurality of memory cell units being formed by connecting a plurality of rewritable memory cells to each of a plurality of word lines,
a word line selection circuit which selects one of said plurality of word lines, a boosting circuit which boosts the potential of said semiconductor substrate and that of said plurality of word lines, and
a control circuit which controls said boosting circuit;
said method comprising
increasing the potential of said semiconductor substrate and that of all of said plurality of word lines to an erase voltage by said boosting circuit, and subsequently decreasing the potential of the word line selected by said word line selection circuit under the control of said control circuit.

12. The method according to claim 11, wherein the erase voltage from said boosting circuit is applied to all the word lines selected by said word line selection circuit out of said plurality of word lines under the control of said control circuit when data of a memory cell is erased.

13. The method according to claim 11, wherein the erase voltage from said boosting circuit is applied to the well regions in said semiconductor substrate under the control of said control circuit when data of a memory cell is erased.

14. The method according to claim 11, wherein the erase voltage from said boosting circuit is applied to all the bit line side selection gates connected respectively between said plurality of memory cell units and the bit lines and all the source line side selection gates connected respectively between said plurality of memory cell units and the source lines under the control of said control circuit when data of a memory cell is erased.

15. The method according to claim 11, wherein only the potential of the word lines connected to the memory cells selected on the basis of a unit of cell block by ways said word line selection circuit which erases data is brought to the ground level under the control of said control circuit when data of a memory cell is erased.

16. The method according to claim 11, wherein all the source line side selection gates in the cell block selected by said word line selection circuit are brought into an electrically conductive state, all the channel potentials of the columns of memory cells in said cell block are increased by the write prohibition voltage from the source lines, subsequently all said source line side selection gates in said cell block are made electrically non-conductive while the bit line side selection gates in said cell block are made electrically conductive according to the page data relating to the word lines connected to the memory cells to be used for writing data, and only the channel potential of the column of memory cells to be used for writing data is brought to the ground level by way of a sense amplifier circuit under the control of said control circuit when data is written into a memory cell.

17. A method of operating a semiconductor memory device, said semiconductor memory device including
a memory cell array arranged on a semiconductor substrate, said memory cell array being formed by arranging a plurality of NAND type memory cell units in array, each of said plurality of NAND type memory cell units being formed by connecting a plurality of rewritable nonvolatile memory cells in series, said plurality of rewritable nonvolatile memory cells being connected respectively to a plurality of word lines, each of said plurality of NAND type memory cell units being connected at an end thereof to a plurality of bit lines and at the other end thereof to a common source line,
a word line selection circuit which selects one of said plurality of word lines,
a bit line selection circuit which selects one of said plurality of bit lines,
a sense amplifier circuit connected to said plurality of bit lines, said sense amplifier circuit having a latch function, a transfer gate being arranged between said sense amplifier circuit and said plurality of bit lines,
a boosting circuit which boosts the potentials of said semiconductor substrate and said plurality of word lines, and
a control circuit which controls said boosting circuit;
said method comprising
increasing the potentials of said semiconductor substrate and that of all of said plurality of word lines to an erase voltage by said boosting circuit, and subsequently decreasing the potential of the word line selected by said word line selection circuit.

18. The method according to claim 17, wherein the erase voltage from said boosting circuit is applied to all the word lines selected by said word line selection circuit out of said plurality of word lines under the control of said control circuit when data of a nonvolatile memory cell is erased.

19. The method according to claim 17, wherein the erase voltage from said boosting circuit is applied to the well regions in said semiconductor substrate under the control of said control circuit when data of a nonvolatile memory cell is erased.

20. The method according to claim 17, wherein the erase voltage from said boosting circuit is applied to all the bit line side selection gates connected respectively between said plurality of NAND type memory cell units and said plurality of bit lines and all the source line side selection gates connected respectively between said plurality of NAND type memory cell units and said common source lines under the control of said control circuit when data of a nonvolatile memory cell is erased.

21. The method according to claim 17, wherein only the potential of the word lines connected to the nonvolatile memory cells selected on the basis of a unit of cell block by ways said word line selection circuit which erases data is brought to the ground level under the control of said control circuit when data of a nonvolatile memory cell is erased.

22. The method according to claim 17, wherein all the source line side selection gates in the cell block selected by said word line selection circuit are brought into an electrically conductive state, all the channel potentials of the columns of memory cells in said cell block are increased by the write prohibition voltage from said common source lines, subsequently all said source line side selection gates in said cell block are made electrically non-conductive while the bit line side selection gates in said cell block are made electrically conductive according to the page data relating to the word lines connected to the nonvolatile memory cells to be used for writing data, and only the channel potential of the column of memory cells to be used for writing data is brought to the ground level by way of a sense amplifier circuit under the control of said control circuit when data is written into a nonvolatile memory cell.

23. A semiconductor memory device comprising:
a memory cell array arranged on a semiconductor substrate,
said memory cell array being formed by arranging a plurality of memory cell units in array,
each of said plurality of memory cell units being formed by connecting a plurality of rewritable memory cells to each of a plurality of word lines;
a word line selection circuit which selects one of said plurality of word lines;
a boosting circuit which boosts the potential of said semiconductor substrate and that of said plurality of word lines; and
a control circuit which controls said boosting circuit, said control circuit being configured to increase the potential of said semiconductor substrate and that of all of said plurality of word lines to an erase voltage by said boosting circuit, and to subsequently decrease the potential of the word line selected by said word line selection circuit while maintaining the potential of the word lines other than the selected word line.

24. The device according to claim 23, wherein each of said plurality of memory cell units comprises columns of memory cells formed by connecting memory cells in series, bit line side selection gates connected in series respectively between said columns of memory cells and the bit lines and source line side selection gates connected in series respectively between said columns of memory cells and the source lines.

25. The device according to claim 23, wherein said memory cell array comprises a plurality of cell blocks, each of said plurality of cell blocks having a predetermined number of memory cell units of said plurality of memory cell units.

26. The device according to claim 23, wherein said memory call array comprises a plurality of cell blocks, said word line selection circuit being selected of said plurality of word lines on the basis of a unit of cell block when data of a memory cell is erased.

27. The device according to claim 23, wherein said semiconductor substrate comprises a semiconductor imurity layer of the first conductivity type, a first well region of a semiconductor impurity layer of the second conductivity type being formed on the surface of said semiconductor substrate, and a second well region of semiconductor impurity layer of the first conductivity type being formed on the surface of said first well region, said memory cell array being formed on the surface of said first well region, said memory cell array being formed on the surface of said well region.

* * * * *